(12) United States Patent
Okabe et al.

(10) Patent No.: US 10,738,374 B2
(45) Date of Patent: Aug. 11, 2020

(54) METHOD OF PERFORMING A SURFACE TREATMENT ON A MOUNTING TABLE, THE MOUNTING TABLE AND A PLASMA PROCESSING APPARATUS

(71) Applicant: TOKYO ELECTRON LIMITED, Tokyo (JP)

(72) Inventors: Shinya Okabe, Nirasaki (JP); Hideaki Yamasaki, Nirasaki (JP); Junya Oka, Nirasaki (JP); Yuuji Kobayashi, Nirasaki (JP); Takamichi Kikuchi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 498 days.

(21) Appl. No.: 15/398,337

(22) Filed: Jan. 4, 2017

(65) Prior Publication Data
US 2017/0204505 A1   Jul. 20, 2017

(30) Foreign Application Priority Data

Jan. 15, 2016 (JP) .................. 2016-006429

(51) Int. Cl.
| | |
|---|---|
| *H01L 21/58* | (2006.01) |
| *C23C 4/134* | (2016.01) |
| *H01J 37/32* | (2006.01) |
| *C23C 16/458* | (2006.01) |
| *C23C 16/44* | (2006.01) |

(Continued)

(52) U.S. Cl.
CPC ............... *C23C 4/134* (2016.01); *C23C 4/11* (2016.01); *C23C 4/137* (2016.01); *C23C 4/18* (2013.01); *C23C 16/4407* (2013.01); *C23C 16/4581* (2013.01); *H01J 37/32568* (2013.01); *H01J 37/32715* (2013.01); *H01L 21/68757* (2013.01);
(Continued)

(58) Field of Classification Search
None
See application file for complete search history.

(56) References Cited

U.S. PATENT DOCUMENTS

| | | | | |
|---|---|---|---|---|
| 5,998,755 A | * | 12/1999 | Zajchowski | ........ B05B 13/0242 |
| | | | | 219/76.16 |
| 2002/0042192 A1 | * | 4/2002 | Tanaka | ................ C23C 16/4404 |
| | | | | 438/485 |

(Continued)

FOREIGN PATENT DOCUMENTS

| | | |
|---|---|---|
| JP | 10-340896 A | 12/1998 |
| JP | 2009-255277 A | 11/2009 |
| WO | 2015/061035 A1 | 4/2015 |

*Primary Examiner* — Shamim Ahmed
(74) *Attorney, Agent, or Firm* — Nath, Goldberg & Meyer; Jerald L. Meyer

(57) ABSTRACT

There is provided a method of performing a surface treatment with respect to a metal mounting table for mounting a substrate to be plasma-processed, the mounting table functioning as a lower electrode configured to generate a plasma by a high frequency power applied between an upper electrode and the lower electrode. The method includes: performing a first surface treatment by spraying a non-sublimation blast material as a non-sublimation material onto a mounting surface of the metal mounting table on which the substrate is mounted, followed by a second surface treatment by spraying a sublimation blast material as a sublimation material onto the mounting surface.

3 Claims, 9 Drawing Sheets

(51) Int. Cl.
*C23C 4/11* (2016.01)
*C23C 4/137* (2016.01)
*C23C 4/18* (2006.01)
*H01L 21/687* (2006.01)

(52) U.S. Cl.
CPC ... *H01J 2237/332* (2013.01); *H01L 21/68742* (2013.01)

(56) References Cited

U.S. PATENT DOCUMENTS

2006/0065634 A1* 3/2006 Van Den Berg ...... C04B 41/009 216/89
2010/0304083 A1* 12/2010 Naritomi ................. C23F 1/26 428/141

* cited by examiner

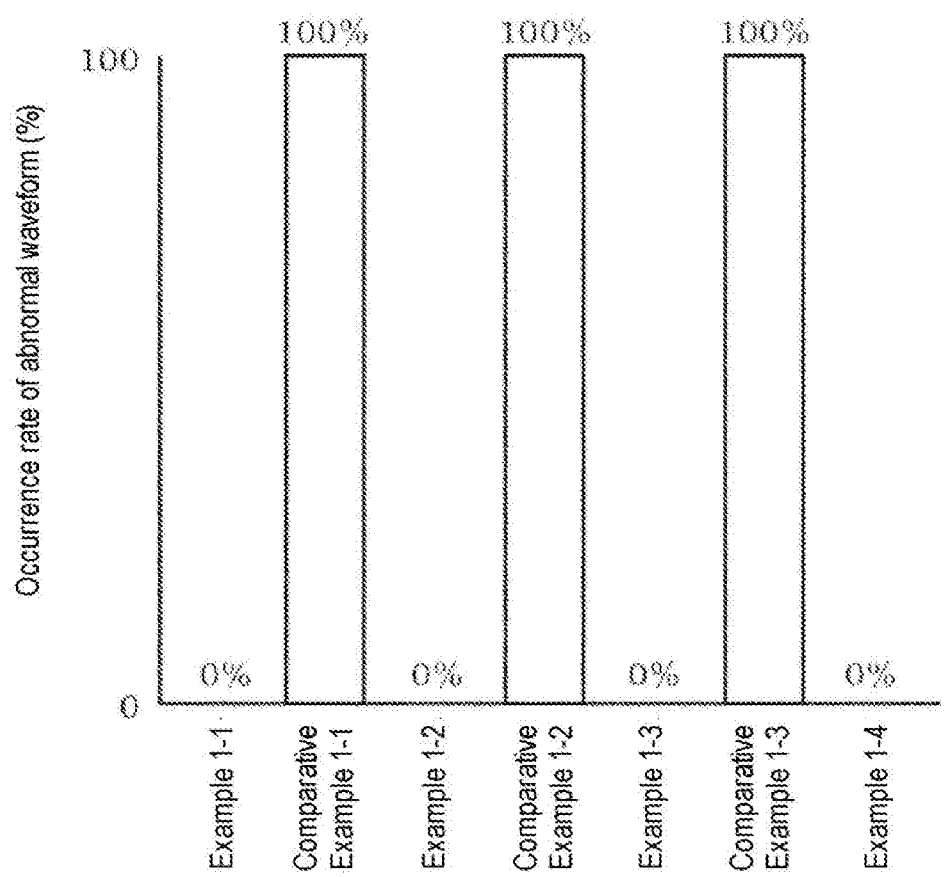

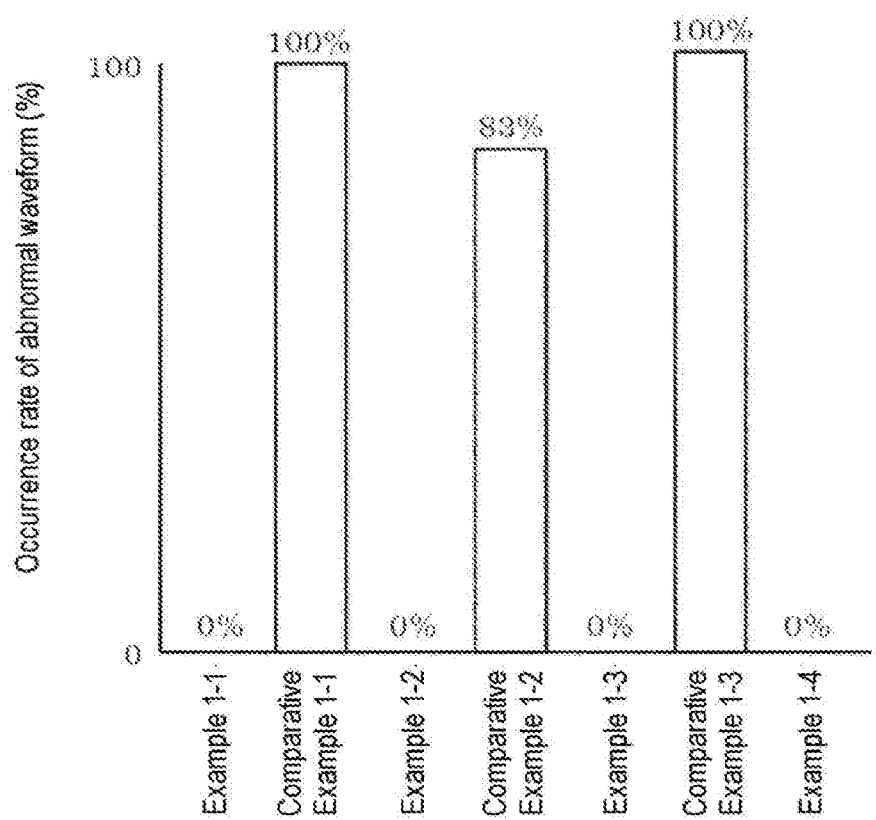

US 10,738,374 B2

METHOD OF PERFORMING A SURFACE TREATMENT ON A MOUNTING TABLE, THE MOUNTING TABLE AND A PLASMA PROCESSING APPARATUS

CROSS-REFERENCE TO RELATED APPLICATION

This application claims the benefit of Japanese Patent Application No. 2016-006429, filed on Jan. 15, 2016, in the Japan Patent Office, the disclosure of which is incorporated herein in its entirety by reference.

TECHNICAL FIELD

The present disclosure relates to a method of performing a surface treatment with respect to a mounting table used when performing a plasma process on a substrate while exciting a process gas to generate a capacitively-coupled plasma, the mounting table treated by the method, and a plasma processing apparatus using the mounting table

BACKGROUND

In a process of fabricating a semiconductor, an etching process or plasma process such as a film-forming process is sometimes performed on a substrate such as a semiconductor wafer (hereinafter, referred to as a "wafer") using capacitively-coupled plasma, inductively-coupled plasma or the like. A plasma processing apparatus using the capacitively-coupled plasma is configured such that a substrate is mounted on a mounting table including a lower electrode inside a processing container and a high frequency power is supplied between an upper electrode installed above the substrate and the lower electrode to plasmarize a process gas.

In recent years, there is a tendency of lowering a temperature in a plasma process. For example, low temperature plasma having a temperature of, e.g., 500 degrees C. or less, specifically, about 450 degrees C. or below, has been used. For example, when alumina ($Al_2O_3$) is used as a material of a mounting table, corrosion is prone to occur on a silicon oxide ($SiO_2$) film. In addition, there is a need to reduce a resistance component in a high frequency circuit containing the plasma. In view of the foregoing, the use of a mounting table made of metal is under consideration.

On the other hand, in order to suppress the generation of particles or prevent the sliding of a wafer, a blasting process of spraying, for example, fine particles of alumina ($Al_2O_3$) onto a surface of a mounting table is performed to finish the mounting table to have a rough surface. However, if a plasma process is performed using the mounting table made of metal, which has been subjected to the blasting process, the plasma may become unstable, which fails to achieve a good plasma process.

For example, there is known a method of performing an alumina-based blasting process to enhance an adhesion of a thin film to a surface of a metal base material of a shower head part, and further performing another blasting process using a dry ice to remove the alumina particles which may remain after the blasting process. However, the related art does not describe on the association between a mounting table located at a back side of a substrate and stabilization of plasma.

SUMMARY

The present disclosure provides a technique for stabilizing plasma in a processing container of a plasma processing apparatus in which high frequency power is applied between an upper electrode and a metallic mounting table functioning as a lower electrode.

According to one embodiment of the present disclosure, there is provided a method of performing a surface treatment with respect to a metal mounting table for mounting a substrate to be plasma-processed, the mounting table functioning as a lower electrode configured to generate a plasma by a high frequency power applied between an upper electrode and the lower electrode, the method including: performing a first surface treatment by spraying a non-sublimation blast material as a non-sublimation material onto a mounting surface of the metal mounting table on which the substrate is mounted, followed by a second surface treatment by spraying a sublimation blast material as a sublimation material onto the mounting surface.

According to another embodiment of the present disclosure, there is provided a method of performing a surface treatment with respect to a metal mounting table for mounting a substrate to be plasma-processed thereon, the mounting table functioning as a lower electrode configured to generate a plasma by a high frequency power applied between an upper electrode and the lower electrode, the method including: performing a first surface treatment by spraying a non-sublimation blast material as a non-sublimation material onto a mounting surface of the metal mounting table on which the substrate is mounted, followed by a second surface treatment by having an excited argon gas to collide against the mounting surface.

According to yet another embodiment of the present disclosure, there is provided a plasma processing apparatus configured to perform a plasma process on a substrate by exciting a process gas supplied into a processing container kept at a vacuum atmosphere to generate a plasma, the apparatus including: the aforementioned mounting table installed within the processing container; and an upper electrode disposed to face a target surface of the substrate mounted on the mounting table and configured to apply a high frequency power between the mounting table and the upper electrode.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9 is a characteristic diagram illustrating occurrence rates of abnormal waveforms in Example 1 and Comparative Example 1.

FIG. 10 is a characteristic diagram illustrating occurrence rates of abnormal waveforms in Example 1 and Comparative Example 1.

DETAILED DESCRIPTION

Figure 1:
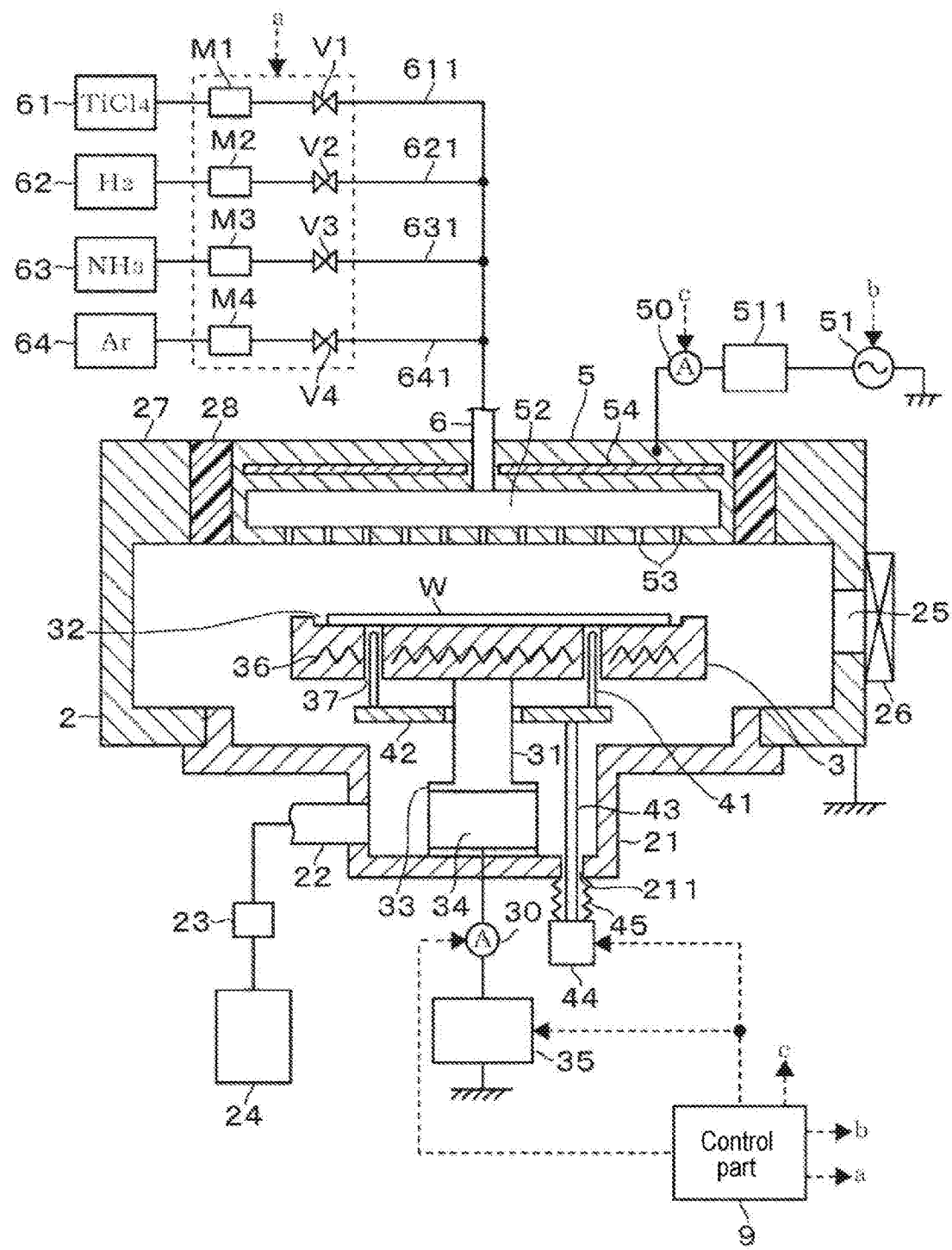
FIG. 1 is a longitudinal sectional view of a plasma processing apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, an example of a configuration of a plasma processing apparatus according to an embodiment of the present disclosure will be described with reference to FIG. 1. This plasma processing apparatus performs a film-forming process of forming, for example, a titanium (Ti) film by a plasma chemical vapor deposition (CVD).

The plasma processing apparatus includes an airtight metal processing container 2 having a substantially cylindrical shape and grounded to the earth. An exhaust chamber 21 having, for example a cylindrical shape and protruding downward, is formed at a central portion of a bottom surface of the processing container 2. An exhaust passage 22 is connected to a side surface of the exhaust chamber 21. A vacuum exhaust part 24 such as a vacuum pump or the like is coupled to the exhaust passage 22 via a pressure regulation part 23 having a pressure regulation valve composed of, for example, a butterfly valve. With this configuration an interior of the processing container 2 is depressurized to a predetermined vacuum pressure. Furthermore, a transfer port 25 through which a wafer W is transferred between a transfer chamber (not shown) and the processing container 2 is formed in a side surface of the processing container 2. The transfer port 25 is configured to be opened and closed by a gate valve 26.

Figure 2A:
FIGS. 2A to 2C are explanatory views illustrating a process of treating a surface of a mounting table installed in the plasma processing apparatus.

A mounting table 3 made of, for example, nickel (Ni) is installed inside the processing container 2 so as to hold the wafer W in a substantially horizontal posture. A surface of the mounting table 3 is cleaned by, for example, pure water or the like, after the processes of assembling, joining and finishing metal components are performed. FIG. 2A is a view schematically illustrating the surface of the mounting table 3, which has been subjected to a surface cleaning.

Figure 2B:
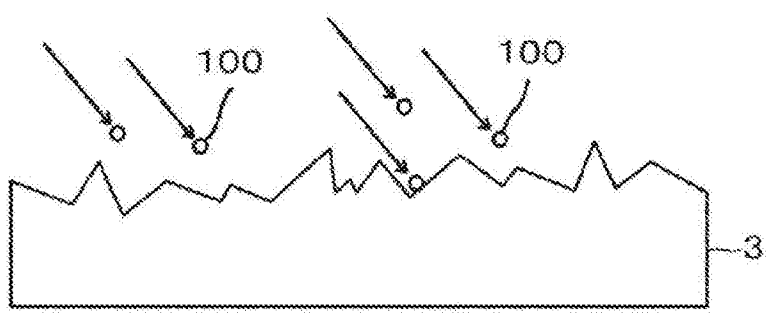
Figure 2C:
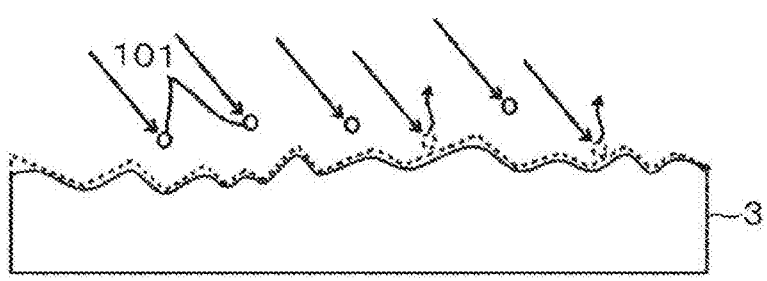

Subsequently, as shown in FIG. 2B, a first blasting process, which is a first surface treatment where fine particles 100 of a non-sublimation blast material such as alumina is sprayed on, onto the entire surface of the mounting table 3 by, for example, an air blast device, is performed. Accordingly, the irregularities are formed on the entire surface of the mounting table 3, including a surface on which the wafer W is mounted, by the collision of the fine alumina particles 100 against the entire surface. In FIGS. 2A to 2C, conditions of the surface of the mounting table 3 are illustrated on a large scale. At this time, the irregularities having an arithmetic mean surface roughness of, for example, 2 to 12 μm, are formed on the surface of the mounting table 3. The expression "arithmetic mean surface roughness" used herein (hereinafter, referred to as an "average surface roughness Ra") represents a value obtained by: subtracting a reference length 1 from a roughness curve in a direction of an average line; taking the direction of the average line of the reference length 1 as an X axis and a direction of a vertical magnification as an Y axis; summing absolute values of deviations from the average line of the reference length 1 to a measurement curve; and taking an average for the summed value. Providing that the roughness curve is expressed as a function of y=f (x), the roughness Ra is obtained from the following equation:

$$Ra = \frac{1}{\ell}\int_0^\ell |t(x)|dx.$$

The first blasting process is to roughen a surface of a metal component constituting the mounting table 3 and inhibit the generation of particles. In addition, the first blasting process is to roughen the surface of the mounting table 3 and reduce a contact surface between the surface of the mounting table and the wafer W. Thus, a static friction force between the surface of the mounting table and the wafer W is increased due to a weight of the wafer W. Moreover, the roughening of the surface of the mounting table 3 causes the gas to flow toward a back surface of the wafer W to easily escape. This makes it possible to prevent the wafer W from floating by the gas existing in a gap between the wafer W and the mounting table 3. Thus, the wafer W is difficult to slide on the surface of the mounting table 3. In view of the foregoing, the average surface roughness Ra of the surface of the mounting table 3 may set to be 5 μm or more.

Subsequently, the cleaning process is performed using the pure water to remove the fine alumina particles 100 adhering to the surface of the mounting table 3. Then, as shown in FIG. 2C, a second blasting process, which is a second surface treatment where a sublimation blast material is spayed, for example, fine particles 101 of dry ice, toward the entire surface of the mounting table 3 by, for example, an air blast device, is performed.

The sublimation blast material such as the fine dry ice particles 101 rapidly sublimate when colliding with a material. Thus, the sublimation blast material becomes vulnerable to impact. For this reason, in the second blasting process, the large irregularities are not formed as they do in the first blasting process using the fine alumina particles 100. As shown in Example 2 to be described later, the average surface roughness Ra after the first blasting process was 10.36 μm, whereas the average surface roughness Ra after the second blasting process was 10.22 μm. That is to say, the average surface roughness Ra obtained by the first blasting process is approximately maintained even after the second blasting process. Therefore, by performing the second blasting process with the fine dry ice particles 101, corners of the irregularities formed by the first blasting process are rounded so that locally high-height sites of convex portions or locally low-height sites of concave portions are decreased in number. The fine dry ice particles 101 adhering to the surface of the mounting table 3 are changed to carbon dioxide ($CO_2$) and sublimated. Moreover, after the first blasting process, the fine alumina particles 100 left in a non-removed state, even though they are subjected to the cleaning process using the pure water, are ejected and removed by the collision of the fine dry ice particles 101 against the fine alumina particles 100.

Thereafter, the mounting table 3 is subjected to a final cleaning process with the pure water. Subsequently, as shown in FIG. 1, a bottom surface of the mounting table 3 is connected at a central portion thereof to a metal supporting member 31. The supporting member 31 includes a flange 33 formed in a lower end thereof. The flange 33 is fixed to a bottom surface of the exhaust chamber 21 via a spacer 34 for maintaining a ground gap. The supporting member 32 is grounded via the spacer 34 and a reactance adjusting part 35 functioning as an impedance adjusting part. The reactance adjusting part 35 is to adjust a reactance (impedance) from a high frequency power source 51 (to be described later) to the ground, through an upper electrode (a gas supplying part 5) (to be described later), the plasma within the processing container 2, the wafer W, the mounting table 3, the supporting member 31 and the spacer 34. For example, the reactance adjusting part 35 is composed of a circuit including a variable condenser. Furthermore, an ammeter 30 for measuring a current value in the mounting table 3 side (a lower electrode side) is installed between the spacer 34 and the reactance adjusting part 35. The supporting member 31 and the processing container 2 are insulated from each other. In some embodiments, the supporting member 31 and the reactance adjusting part 35 may be electrically connect to each other and the spacer 34 may be configured as, for example, an insulating material.

In addition, a heater 36 is embedded in the mounting table 3 to heat the wafer W to a predetermined temperature, for example, 500 degrees C. or less, specifically, about 450 degrees C., according to the power supplied from a power source (not shown), based on a control signal inputted from a control part 9 (to be described later). A pocket 32 as a recess portion for holding the wafer W is formed in the surface of the mounting table 3. The wafer W is mounted within the pocket 32. In some embodiments, a guide ring may be provided at a periphery of the surface of the mounting table 3 to guide the wafer W. For example, three through holes 37 are formed in the mounting table 3 in a circumferential direction. Three or more (e.g., three) elevation pins 4 as an elevation member are installed inside the respective through holes 37 to move up and down the wafer W mounted on the mounting table 3 while holding the wafer W. The elevation pins 41 are formed of, for example, ceramics such as alumina, or quartz. The elevation pins 41 are coupled to an elevation mechanism 44 composed of, for example, an air cylinder which is provided outside the processing container 2, via a support body 42 and an elevation shaft 43. For example, the elevation mechanism 44 is provided below the exhaust chamber 21. A bellows body 45 is installed between the elevation mechanism 44 and an opening 211 formed in a bottom surface of the exhaust chamber 21, and the elevation shaft 43 passes through the opening 211.

The gas supplying part 5 made of metal and constituting the upper electrode is provided at a ceiling portion of the processing container 2 via an insulating member 28. The gas supplying part 5 is connected to the high frequency power source 51 via a matching device 511. Accordingly, the plasma processing apparatus of the present disclosure is configured as a parallel-plate type plasma processing apparatus which supplies an exciting gas into the processing container 2 and applies a high-frequency power between the mounting table 3 constituting the lower electrode and the gas supplying part 5 constituting the upper electrode to generate the plasma. Further, an ammeter 50 is provided between the matching device 511 and the gas supplying part 5 to measure a current value in a side of the upper electrode.

A gas supplying chamber 52 is formed within the gas supplying part 5. In a bottom surface of the gas supplying chamber 52, for example, a plurality of holes 53 is evenly formed to distribute and supply a process gas into the processing container 2. A heating mechanism 54 is embedded in the gas supplying part 5, for example, in an upper side of the gas supplying chamber 52, to heat the gas supplying chamber 52 at a predetermined temperature, according to power supplied from a power source (not shown), based on a control signal inputted from the control part 9.

An end portion of a downstream side of a gas supplying passage 6 is connected to the gas supplying chamber 52. An upstream side of the gas supplying passage 6 is joined with a $TiCl_4$ gas supplying duct 611 used as a flow passage for supplying a raw material gas containing a titanium tetrachloride ($TiCl_4$), a hydrogen ($H_2$) gas supplying duct 621 for supplying a reducing gas, an $NH_3$ gas supplying duct 631 for supplying an ammonia gas ($NH_3$) for nitridation and an argon (Ar) gas supplying duct 641. A $TiCl_4$ gas supplying source 61 is connected to an end portion of an upstream side of the $TiCl_4$ gas supplying duct 611. A flow rate control part M1 and a valve V1 are installed in the $TiCl_4$ gas supplying duct 611 in this order from the upstream side. A $H_2$ gas supplying source 62 is connected to an end portion of an upstream end of the H gas supplying duct 621. A flow rate control part M2 and a valve V2 are installed in the $H_2$ gas supplying duct 621 in this order from the upstream side. A $NH_3$ gas supplying source 63 is connected to an end portion of an upstream end of the $NH_3$ gas supplying duct 631. A flow rate control part M3 and a valve V3 are installed in the $NH_3$ gas supplying duct 631 in this order from the upstream side. An argon gas supplying source 64 is connected to an end portion of an upstream side of the argon gas supplying duct 641. A flow rate control part M4 and a valve V4 are installed in the argon gas supplying duct 641 in this order from the upstream side. Furthermore, in this embodiment, although not being shown in the figure, an inert gas supplying duct and a gas supplying source which supply an inert gas such as a nitrogen ($N_2$) gas may be connected to the processing container 2 in order to control an internal pressure of the processing container 2.

Figure 3:
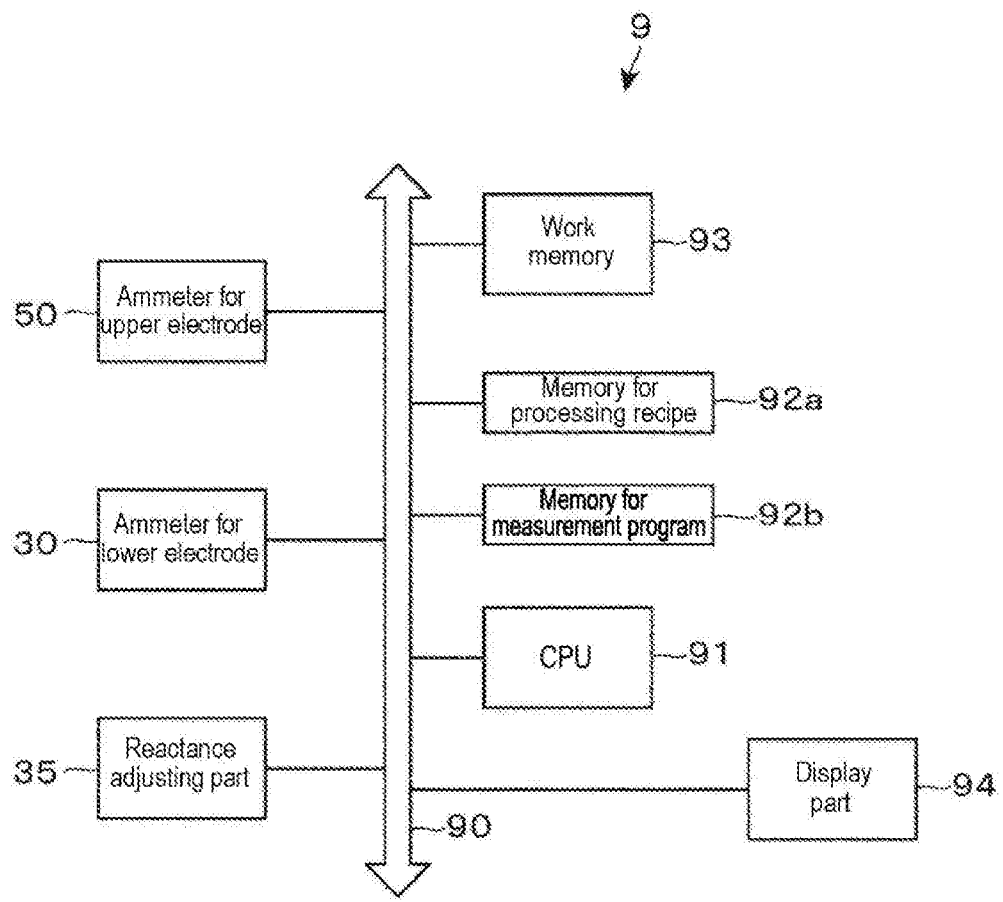
FIG. 3 is a diagram illustrating a configuration of a control part in the plasma processing apparatus.

The plasma processing apparatus includes the control part 9 composed of a computer for controlling the overall operation of the plasma processing apparatus. As shown in FIG. 3, the control part 9 includes a CPU 91, memories 92a and 92b, and a work memory 93. Reference numeral 90 in the figure indicates a bus. A processing recipe in which a sequence of processes and the like are written is stored in the memory 92a. A measurement program for measuring variations in a current value in each of the gas supplying part 5 side (the upper electrode side) and the mounting table 3 side (the lower electrode side) by varying a reactance value of the reactance adjusting part 35 before performing a process on the wafer W is stored in the memory 92b. The processing recipe and the measurement program are installed from a memory medium such as a hard disk, a compact disk, a magnet-optical disk, a memory card, a flexible disk or the like, into the control part 9.

Next, a measurement operation performed by a group of steps of the measurement program will be described. For example, if a monitoring wafer W on which a silicon oxide film is formed is mounted on the mounting table 3, an argon (Ar) gas is supplied from the gas supplying part 5. Thereafter, the high frequency power source 51 is turned on so that the high frequency power is applied between the gas supplying part 5 and the mounting table 3 to generate the plasma of the argon gas inside the processing container 2. Then, by varying a reactance value in the reactance adjusting part 35, a measurement value of the ammeter 50 of the upper electrode side and a measurement value of the ammeter 30 of the lower electrode side with respect to the respective varied reactance values are recorded in the work memory 93. Graphs in which the current value of the upper electrode side and the current value of the lower electrode side are prepared to be mapped with the reactance value are displayed on, for example, a display part 94, respectively. In some embodiments, a sequence of measurement operations may be performed in a state where the wafer W is not mounted on the mounting table 3. While there has been described an example in which only the argon gas is supplied to generate the plasma, a mixed gas of the Ar gas and a $H_2$ gas, ultimately $TiCl_4$ gas may be introduced to generate the plasma.

Next, operations of the plasma processing apparatus according to the embodiment described above will be explained. For example, a new mounting table 3 is mounted in the plasma processing apparatus, and subsequently, a monitoring wafer W is mounted on a substrate-mounting surface of the mounting table 3 with the cooperation of the elevation pins 41 and an external transfer mechanism. Subsequently, the reactance value of the reactance adjusting part 35 is adjusted to adjust the plasma to be formed inside the processing container 2. That is to say, a reactance value from the wafer W mounted on the mounting table 3 as the lower electrode to the ground is adjusted.

In adjusting the reactance value, the current value of the upper electrode side and the current value of the lower electrode side are measured according to the measurement program while varying the reactance value. As described above, first, the Ar gas is supplied from the Ar gas supplying duct 641 into the processing container 2, and the high frequency power is then applied from the high frequency power source 51 to the gas supplying part 5. With this configuration, a parallel-plate type electrode is defined by the gas supplying part 5 constituting the upper electrode and the mounting table 3 constituting the lower electrode so that the Ar gas is excited to generate a capacitively-coupled plasma.

Figure 4:
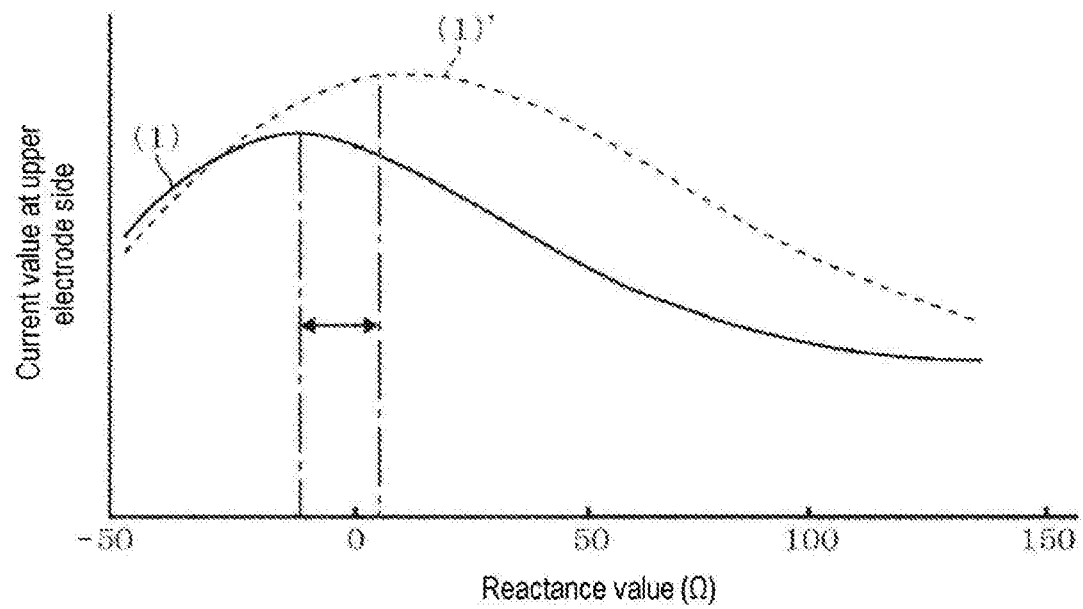
FIG. 4 is an explanatory view illustrating current values of an upper electrode side with respect to reactance values.
Figure 5:
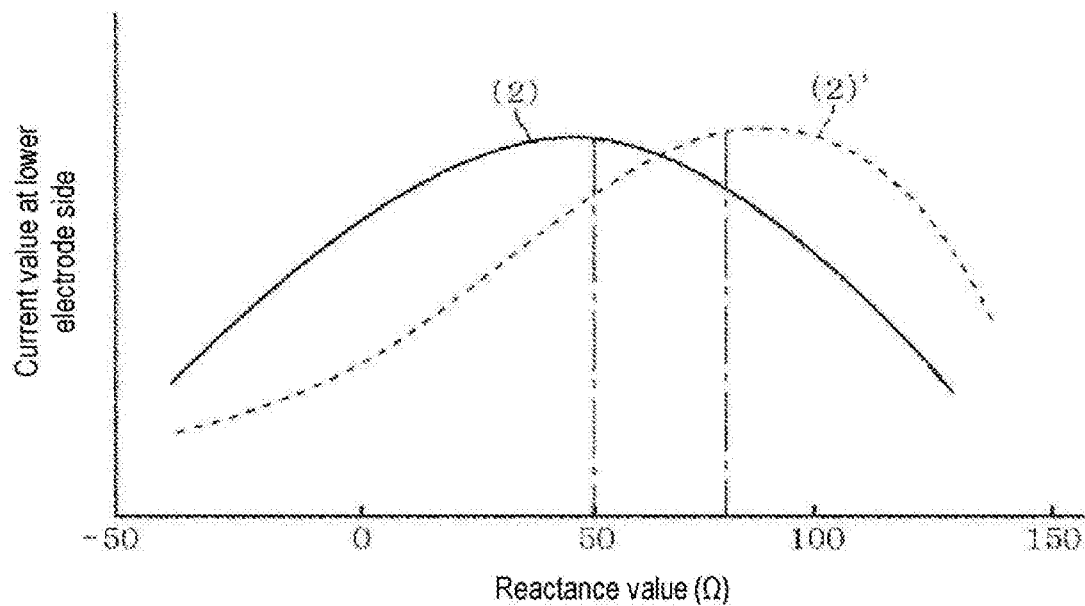
FIG. 5 is an explanatory view illustrating current values of a lower electrode side with respect to reactance values.

In this state, the reactance value in the reactance adjusting part 35 is varied, for example, from $-40\Omega$ to $130\Omega$, and the current value of the upper electrode side and the current value of the lower electrode side are measured. Thereafter, the graphs illustrating a relationship between the reactance value and the current value of the upper electrode side and a relationship between the reactance value and the current value of the lower electrode side, respectively, as shown in FIGS. 4 and 5, are displayed on the display part 94. That is to say, the graphs represent patterns of variations in the current values with respect to the variations in the reactance value (impedance value). Hereinafter, for the sake of convenience in description, the patterns of variations are referred to as "waveforms". From the waveforms of these graphs, an operator reads a reactance value at which, for example, the current value of the upper electrode side becomes a maximum value, and sets the reactance adjusting part 35 such that the reactance adjusting part 35 has the respective reactance value. This suppresses an abnormal electrical discharge from occurring between the upper electrode and the wall portion of the processing container 2, thus making the plasma to be in a stable state.

Next, relationships between the first and second blasting processes as described above, which have been performed on the mounting table 3, and the waveforms of the current values will be explained. As shown in Example 1 to be described later, in a case where the second blasting process is not performed after the first blasting process is performed on the mounting table 3, there may be a case where, as for the current value of the upper electrode side, a normal waveform in which the current value of the upper electrode side reaches the maximum value at a reactance value of about $-10\Omega$ appears as Curve (1) indicated by a solid line in the graph of FIG. 4, and an abnormal waveform in which the current values of the upper electrode side reaches the maximum value at a reactance value of about 510 appears as Curve (1)' indicated by a broken line in the graph of FIG. 4. Otherwise, there may be a case where an abnormal value deviated from the normal waveform appears in some of the reactance values in Curve (1) of the graph of FIG. 4 (this case is also regarded as the abnormal waveform).

Likewise, when the current value of the lower electrode side is measured, there may be a case where a normal waveform in which the current value of the lower electrode side reaches a peak at a reactance value of about $50\Omega$ appears as Curve (2) indicated by a solid line in the graph of FIG. 5, and an abnormal waveform in which the current value of the lower electrode side reaches the maximum value at a reactance value of about $75\Omega$ appears as Curve (2)' indicated by a broken line in the graph of FIG. 5. Otherwise, there may be a case where an abnormal value deviated from the normal waveform appears in some of the reactance values in Curve (2) of the graph of FIG. 5.

On the contrary, in a case where the second blasting process is performed after the first blasting process is performed on the mounting table 3, the waveform of the current value of the upper electrode side appears only as a normal waveform like Curve 1 indicated by the solid line in FIG. 4, and the waveform of the current value of the lower electrode side appears only as a normal waveform like Curve 2 indicated by the solid line in FIG. 5.

A reason why the abnormal waveform appears will be discussed. As shown in verification tests to be described later, if the first blasting process is performed on the mounting table 3 but the second blasting process is not performed, the abnormal waveform may appear in a case where the wafer W with a thick silicon oxide film formed thereon is mounted or in a case where the mounting table 3 has a large average surface roughness Ra, for example, the average surface roughness of the mounting table 3 is set to a value of at least 5 μm.

Figure 6:
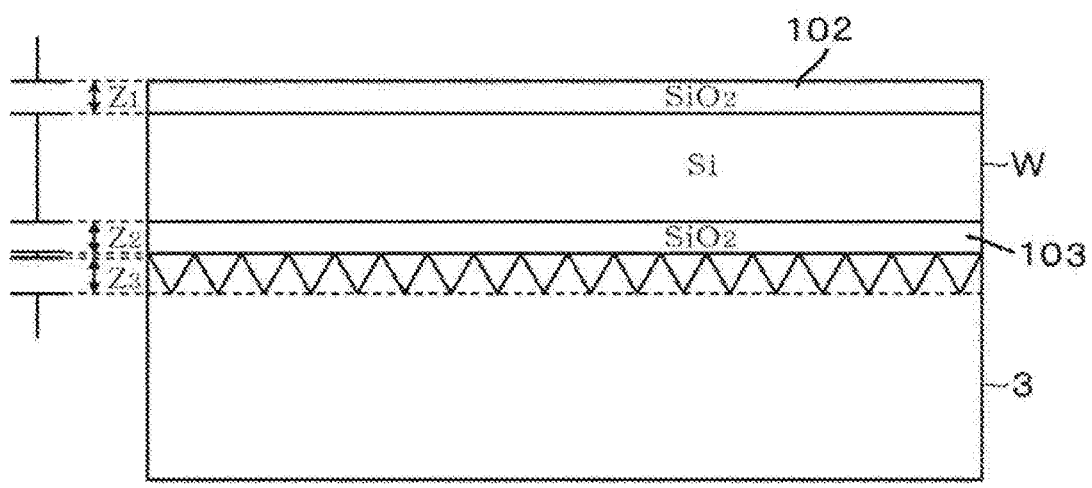
FIG. 6 is an explanatory view schematically illustrating an equivalent circuit defined in a wafer and a mounting table.
Figure 7:
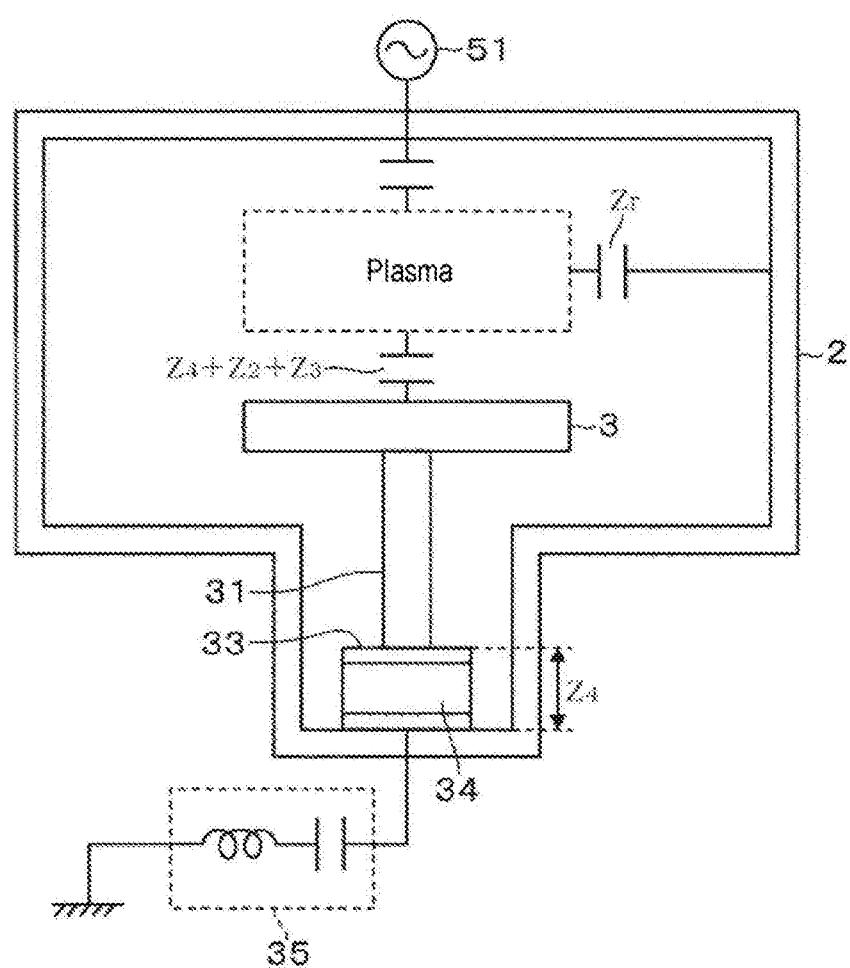
FIG. 7 is an explanatory view schematically illustrating an equivalent circuit in the plasma processing apparatus.

In the plasma processing apparatus, when the high frequency power is applied to the upper electrode side, the equivalent circuits are perceptually defined inside the processing container 2 in which the mounting table 3 and the wafer W mounted on the mounting table 3 are accommodated, as shown in FIGS. 6 and 7. In FIG. 7, the plasma processing apparatus is shown in a simplified manner. When the high frequency power is applied to the upper electrode as shown in FIG. 6, an impedance Z1 caused by a film thickness of an oxide film 102 such as a silicon oxide film formed on the front surface of the wafer W, an impedance Z2 caused by a film thickness of an oxide film 103 formed on the back surface of the wafer W, and an impedance Z3 caused at a site where the irregularities are formed by performing the blasting process on the surface of the mounting table 3 exist in this order from the front surface of the wafer F up to an interior of the mounting table 3. Furthermore, an impedance Z4 caused by an assembly of the mounting table 3, which is composed of, for example, the flange 33, the spacer 34 and screw members for fastening the mounting table 3, exists between the interior of the mounting table 3 and a ground potential, as shown in FIG. 7.

Assuming that an impedance between a plasma generating region and the processing container 2 is Zr, if a value of Z1+Z2+Z3+Z4 is relatively smaller than that of Zr, a high frequency current flows from the plasma generating region toward the mounting table 3. For this reason, the location or density distribution of the plasma is decided according to a high frequency electric field generated between the upper electrode and the lower electrode. At this time, the waveforms represented respectively by the current value of the upper electrode side and the current value of the lower electrode side with respect to the reactance value of the reactance adjusting part 35 become normal waveforms.

However, if the value of Z1+Z2+Z3+Z4 is relatively greater than that of Zr, a high frequency current easily flows to the processing container 2 side (Zr side). If a current path is formed at the Zr side, an abnormal electrical discharge occurs so that the density distribution of the plasma formed in the processing container 2 is disturbed. Therefore, when the current value at each of the lower electrode side and the upper electrode side is measured while varying the reactance value, the waveforms represented by each of the current value of the upper electrode side and the current value of the lower electrode side with respect to the reactance value appear as waveforms different from the normal waveform, i.e., abnormal waveforms.

Descriptions will be made on factors determining the impedances Z1 to Z4. As can be seen from verification tests to be described later, if the film thicknesses of the silicon oxide films (thermal oxide films) 102 and 13 formed on the surface of the wafer W are increased, the abnormal waveforms are prone to occur. It is believed that this phenomenon is caused by a fact that if the film thicknesses of the silicon oxide films 102 and 103 formed on the wafer W are increased, an electrostatic capacitance is reduced so that the impedances Z1 and Z2 are increased. Accordingly, it is presumed that if the wafer W on which the silicon oxide films 102 and 103 having large thicknesses are formed is subjected to a plasma process, the abnormal waveforms are prone to occur.

Further, as can be seen from the verification tests to be described later, if the average surface roughness of the mounting table 3 is increased, the abnormal waveform is prone to occur. Therefore, if the average surface roughness Ra of the mounting table 3 is increased, the impedance Z3 needs to be increased. When the irregularities are formed in the surface of the mounting table 3, the maldistribution of the electric charges tends to occur in tips of convex portions or bottoms of concave portions. Such maldistributed electric charges cause an electric charging to form an electrostatic capacitance. In addition, if the average surface roughness Ra is increased, the differences between height positions of the tips of the convex portions and height positions of the bottoms of the concave portions are increased, whereby an electrical distance between the wafer W and the mounting table 3 is increased. Thus, since the electrostatic capacitance is decreased, the impedance Z3 needs to be increased. In addition, it is believed that the impedance Z4 is decided by, for example, a contact resistance caused when installing the flange 33 or an insulation property at a location where conductive portions of the flange 33 approach to each other.

Therefore, if the thicknesses of the silicon oxide films 102 and 103 formed on the wafer F are increased, or if the average surface roughness Ra of the mounting table 3 is increased, the value of Z1+Z2+Z3+Z4 is increased so that the abnormal waveform is prone to occur.

Here, as shown in Example 1 to be described later, the first blasting process is performed on the surface of the mounting table 3 and subsequently the second blasting process using spraying of the fine dry ice particles 101 is performed so that the occurrence of the abnormal waveform is suppressed. Furthermore, as shown in Example 2 to be described later, it can be seen that in the tips of the convex portions and the bottoms of the concave portions, the areas of locally high-height and low-height portions are decreased by performing the second blasting process using the spraying of the fine dry ice particles 101. Accordingly, it can be presumed that the occurrence of the abnormal waveform is suppressed by reducing the degree of sharpness of the irregularities (by rounding the sharpness).

It can be further presumed that corner portions are rounded by performing the second blasting process, and the areas of the locally high-height and low-height portions in the tips of the convex portions and the bottoms of the concave portions are decreased, whereby the area of charged regions is enlarged as compared with a case where the tips of the convex portions and the bottoms of the concave portions are sharp. Thus, the electrostatic capacitance between the surface of the mounting table 3 and the back surface of the wafer W is increased so that the impedance is reduced. Accordingly, it is possible to suppress the value of Z1+Z2+Z3+Z4 to a low value. Thus, it is presumed that, by varying the reactance value using the reactance adjusting part 35, the aforementioned abnormal waveform is difficult to occur.

After the reactance value of the reactance adjusting part 35 is adjusted such that the peak of the current value of the upper electrode side is obtained and a condition in which the plasma is stably generated inside the processing container 2 is set, a film-forming process is performed on the wafer W. First of all, a wafer W which is to be subjected to the film-forming process is mounted on the substrate-mounting surface of the mounting table 3 with the cooperation of the elevation pins 41 and the external transfer mechanism. Since the mounting table 3 and the gas supplying part 5 have been already heated by the heating mechanism 54, the wafer W mounted on the mounting table 3 is heated at a temperature of, for example, 450 degree C. The interior of the processing container 2 is set to have a predetermined pressure by the vacuum exhaust part 24. Furthermore, the $TiCl_4$ gas, the Ar gas and the $H_2$ gas as a film-forming gas are supplied into the processing container 2 via the gas supplying part 5, and the high frequency power is applied from the high frequency power source 51 to the gas supplying part 5. This configuration forms the parallel-plate type electrodes by the upper electrode constituting the gas supplying part 5 and the lower electrode constituting the mounting table 3, thus generating a capacitively-coupled plasma in the plasma generating region. Thus, the $TiCl_4$ gas and the $H_2$ gas are activated and reacted with each other so that a Ti film is formed on the surface of the wafer W.

Subsequently, the supply of the $TiCl_4$ gas, the Ar gas and the $H_2$ gas is stopped, the supply of the high frequency power to the gas supplying part 5 is stopped, and the interior of the processing container 2 is exhausted to discharge the $TiCl_4$ gas, the Ar gas and the $H_2$ gas from the processing container 2. Subsequently, the $NH_3$ gas, the Ar gas and the $H_2$ gas are supplied into the processing container 2 so that a surface of the Ti film is nitrided by the $NH_3$ gas to form a TiN (titanium nitride) layer. In some embodiments, an additional TiN layer may be further laminated and the surface of the wafer W may be covered with the TiN film so as to prevent the Ti film from being peeled off in a subsequent process. When the Ti film is formed, the plasma inside the processing container 2 is stabilized as described above. It is therefore possible to stabilize the plasma process for the wafer W.

According to the aforementioned embodiment, the first blasting process of spraying the fine alumina particles 100 onto the substrate-mounting surface of the mounting table 3 made of metal, which functions as the lower electrode within the processing container 2 is performed, and subsequently, the second blasting process of spraying the fine dry ice particles 101 is performed. Accordingly, the corner portions of the irregularities formed by spraying the fine alumina particles 100 are rounded. This reduces impedance defined between the wafer W and the mounting table 3 in a high frequency current path ranging from the high frequency power source 51 to the ground via a series of the gas supplying part 5 (the upper electrode), the wafer W and the mounting table 3. Therefore, it is possible to suppress the formation of a current path from the plasma generating region toward the sidewall of the processing container 2 or the like, thus stabilizing the plasma and performing a stable plasma process.

Further, the surface of the mounting table 3 is roughened to suppress the generation of the particles. The surface of the mounting table 3 is roughened to reduce the contact area between the mounting table 3 and the wafer W. Thus, the static friction force caused by the weight of the wafer W is increased, and the gas flowing around the back surface of the wafer W is easy to escape. This makes the wafer W hard to slide. In view of the foregoing, an average surface roughness Ra of the mounting table 3 may be set to 5 µm or more.

Another Embodiment

In a plasma processing apparatus according to another embodiment, a mounting table 3 may be subjected to the first blasting process as the first surface treatment, followed by a second surface treatment in which an Ar plasma is irradiated onto the surface of the mounting table 3. For example, the mounting table 3 is subjected to the first blasting process followed by the cleaning process using the pure water, and subsequently is installed at the respective location of the plasma processing apparatus shown in FIG. 1. Subsequently, the Ar gas is supplied into the processing container 2 and the high frequency power is supplied from the high frequency power source 51. The Ar gas excited by the high frequency power is attracted to and collides against the mounting table 3. As a result, like the surface of the mounting table 3 shown in FIG. 2C, which has been subjected to the second blasting process, the corner portions of the irregularities formed by the first blasting process can be rounded by the collision of the Ar plasma. In some embodiments, after the Ar plasma-based process, the mounting table 3 may be unloaded from the plasma processing apparatus, followed by being subjected to a final cleaning process, and then loaded into the plasma processing apparatus again. Even in such a configuration, it is possible to round the corner portions of the irregularities formed on the surface of the mounting table 3. Therefore, by installing the mounting table 3 with corner portions thus rounded in the plasma processing apparatus, it is possible to suppress an abnormal waveform from occurring in waveforms obtained by the current value of the upper electrode side and the current value of the lower electrode side with respect to the reactance value. The first blasting process and the second blasting process are not particularly restricted as long as they are performed on at least the mounting surface of the mounting table 3 on which the wafer W is mounted. Likewise, by performing the Ar plasma-based process on the mounting surface of the mounting table 3, it is possible to obtain desired effects.

If the mounting table 3 is used for a long period of time, the average surface roughness Ra is lowered by friction between the mounting table 3 and the wafer W. Accordingly, there may be a case where a recycling process of unloading the mounting table 3 from the plasma processing apparatus and performing an alumina-based blasting process on the surface of the mounting table 3 to increase the average surface roughness Ra of the mounting table 3 is performed. Even in this case, immediately after performing the alumina-based blasting process on the surface of the mounting table 3, the tips of convex portions or the bottoms of concave portions of the irregularities formed on the surface of the mounting table 3 remains sharp. Thus, an abnormal waveform is prone to occur in waveforms obtained by the current value of the upper electrode side and the current value of the lower electrode side with respect to the reactance value. Accordingly, even in the case where the recycling process is performed, just like the process of manufacturing the mounting table 3, the first blasting process of spraying the fine alumina particles 100 onto the surface of the mounting table 3 using, for example, an air blast device, is performed, and subsequently, the cleaning process using the pure water is performed on the surface of the mounting table 3. Thereafter, the second blasting process of spraying, for example, the fine dry ice particles 101 toward the entire surface of the mounting table 3 using an air blast device, is performed. Subsequently, the mounting table 3 is subjected to the final cleaning process and then installed in the plasma processing apparatus. In this way, it is possible to suppress an abnormal waveform from occurring in the waveforms obtained by the current value of the upper electrode side and the current value of the lower electrode side with respect to the reactance value.

[Verification Test 1]

The following tests were performed to investigate a relationship between an average surface roughness Ra of the mounting table 3, a film thickness of a silicon oxide film (so-called thermal oxide film obtained by heating and oxidizing a silicon layer) formed on the wafer W and an occurrence rate of an abnormal waveform.

(Sample 1)

The first blasting process using alumina was performed on the mounting table 3 in the plasma processing apparatus shown in FIG. 1 such that the average surface roughness Ra is set to 2 µm. In addition, six wafers on each of which silicon oxide films are formed to respectively have thicknesses of 1000, 3000, 4000 and 10000 Å were prepared, and each of the wafers W was mounted on the mounting table 3. Then, the occurrence rate of the abnormal waveform in the waveforms obtained by the current value of the upper electrode side and the current value of the lower electrode side with respect to the reactance value was measured while varying the reactance value in a range from −40Ω to +130Ω for each of the silicon oxide films having the respective thicknesses.

(Sample 2)

Sample 2 was obtained by performing the same process as that applied for Sample 1 except that the average surface roughness Ra of the mounting table 3 is set to 9.3 µm and wafers on which silicon oxide films are formed to respectively have thicknesses of 1000 and 5500 Å, are used.

(Sample 3)

Sample 3 was obtained by performing the same process as that applied for Sample 1 except that the average surface roughness Ra of the mounting table 3 is set to 9.5 μm and wafers on which silicon oxide films are formed to respectively have thicknesses of 1000, 3000, 4000, 5500, 7500 and 10000 Å, are used.

(Sample 4)

Sample 4 was obtained by performing the same process as that applied for Sample 1 except that the average surface roughness Ra of the mounting table 3 is set to 9.8 μm and wafers on which silicon oxide films are formed to respectively have thicknesses of 1000, 1500, 3000, 5500, 7500 and 10000 Å, are used.

(Sample 5)

Sample 5 was obtained by performing the same process as that applied for Sample 1 except that the average surface roughness Ra of the mounting table 3 is set to 10 μm and wafers on which silicon oxide films are formed to respectively have thicknesses of 1000, 3000 and 5500 Å, are used.

(Sample 6)

Sample 6 was obtained by performing the same process as that applied for Sample 1 except that the average surface roughness Ra of the mounting table 3 is set to 10.5 μm and wafers on which silicon oxide films are formed to respectively have thicknesses of 1000, 3000 and 5500 Å are used.

(Sample 7)

Sample 7 was obtained by performing the same process as that applied for Sample 1 except that the average surface roughness Ra of the mounting table 3 is set to 10.8 μm and wafers on which silicon oxide films are formed to respectively have thicknesses of 500, 750, 1000, 1200, 2000, 3000, 4000 and 10000 Å, are used.

Figure 8:
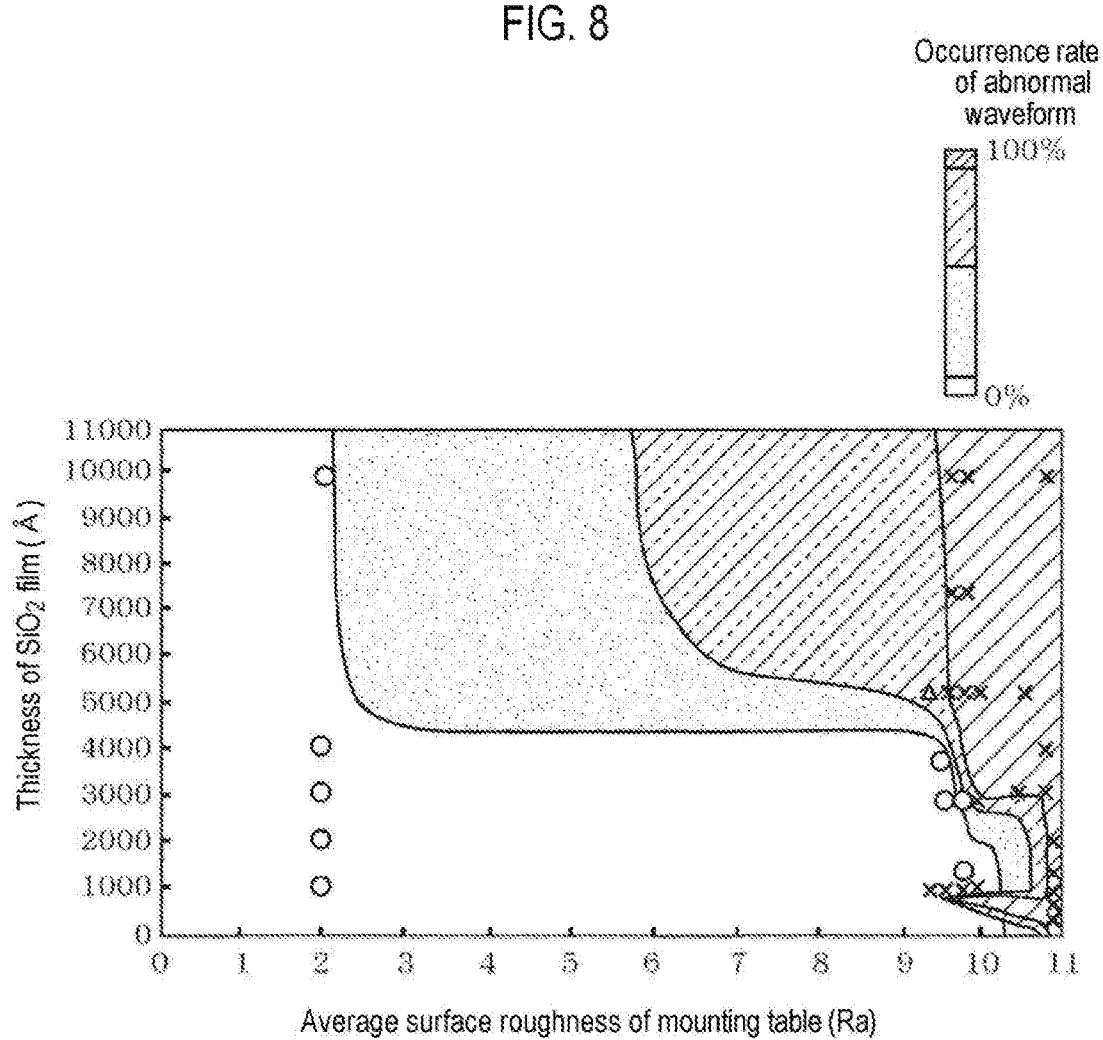
FIG. 8 is a characteristic diagram illustrating occurrence rates of abnormal waveforms corresponding to a thickness of a film formed on the wafer and an average surface roughness Ra of the mounting table.

The occurrence rate of an abnormal waveform for each of the film thicknesses of the wafers W in each of the samples was measured. FIG. 8 is a view showing contour maps with the average surface roughness Ra of the mounting table 3 as a horizontal axis and the thickness of each silicon oxide film formed on the wafer W as a vertical axis. The contour maps were prepared by indicating the occurrence rates of the abnormal waveforms in the respective samples in heights and plotting points at locations of coordinates representing the respective samples.

In the respective samples, symbols are marked at locations of coordinates representing the measured thicknesses of the silicon oxide films so as to represent the occurrence rates of the abnormal waveforms. Symbol "O" indicates that the occurrence rate of the abnormal waveform is 0%, Symbol "Δ" indicates that the occurrence rate of the abnormal waveform is 1 to 99% and Symbol "X" indicates that the occurrence rate of the abnormal waveform is 100%.

As shown in FIG. 8, the abnormal waveform was not occurred in all the wafers W of Sample 1 in which the average surface roughness Ra is set to 2 μm. As for Sample 2 in which the average surface roughness Ra is set to 9.3 μm, the abnormal waveform was occurred when the film thickness of the silicon oxide film was 550 Å. As for Samples 3 to 5 in which the average surface roughness Ra is set to fall within a range of 9.5 to 10 μm, the abnormal waveform was occurred in all the wafers when the film thickness of the silicon oxide film was 5500 Å or more. As for Sample 7 in which the average surface roughness Ra is set to 10.8 μm, the abnormal waveform was occurred in all the wafers.

Further, even when the film thickness of the silicon oxide film was 1000 Å or less, the abnormal waveform was occurred.

According to these results, it can be said that the abnormal waveform is easy to occur as the thickness of the silicon oxide film is increased. Moreover, it can be said that the abnormal waveform is easy to occur as the average surface roughness Ra of the mounting table 3 is increased.

Example 1

A mounting table 3 was prepared to have an average surface roughness Ra of 10 μm by performing the first blasting process followed by the second blasting process. In Example 1, four mounting tables 3 were prepared which are designated by Example 1-1, Example 1-2, Example 1-3 and Example 1-4, respectively. In Comparative Example 1, three mounting tables 3 were prepared by performing the same process as that in Example 1 except that they are not subjected to the second blasting process. Examples of the three mounting tables 3 prepared in Comparative Example 1 are designated by Comparative Example 1-1, Comparative Example 1-2 and Comparative Example 1-3, respectively.

In each of the mounting tables 3 of Example 1 and Comparative Example 1, the occurrence rate of an abnormal waveform was measured using six wafers on each of which a silicon oxide film is formed to have a thickness of 1000 Å, and six wafers on each of which a silicon oxide film is formed to have a thickness of 3000 Å.

FIGS. 9 and 10 show the results thus measured. FIG. 9 shows the occurrence rates of abnormal waveforms in the mounting tables 3 of Examples 1-1 to 1-4 and Comparative examples 1-1 to 1-3 when the wafers W on each of which the silicon oxide film is formed to have a thickness of 1000 Å, are mounted on the mounting tables 3, respectively. FIG. 10 shows the occurrence rates of abnormal waveforms in the mounting tables 3 of Examples 1-1 to 1-4 and Comparative examples 1-1 to 1-3 when the wafers W on each of which the silicon oxide film is formed to have a thickness of 3000 Å, are mounted on the mounting tables 3, respectively. Even in a case where the wafer W on which the silicon oxide film is formed to have the thickness of either 1000 Å or 3000 Å is used, the abnormal waveform was detected in substantially all the wafers W of Comparative Examples 1-1, 1-2 and 1-3. On the contrary, the abnormal waveform was not detected in all the wafers W of Examples 1-1 to 1-4. According to these results, it can be said that, by performing the first blasting process followed by the second blasting process, it is possible to suppress the abnormal waveform from occurring in waveforms obtained by the current value of the upper electrode side and the current value of the lower electrode side with respect to the reactance value.

Example 2

As Example 2, a mounting table 3 having an average surface roughness Ra of 10 μm was prepared by performing the first blasting process followed by the second blasting process. Further, as Comparative Example 2, another mounting table 3 was prepared by performing the same process as that in Example 2 except that the second blasting process was not performed. The surfaces of the mounting tables 3 in Example 2 and Comparative Example 2 were photographed by a scanning electron microscope (SEM) to calculate contrast values of the surfaces. Assuming that sites whose contrast values are equal to and greater than a certain threshold are locally high-height sites (tips of convex portions), the area of the sites was measured. Further, assuming that sites whose contrast values is less than the certain threshold are locally low-height sites (bottoms of concave portions), the area of the sites was measured. The average surface roughness Ra in Example 2 and Comparative Example 2 was 10.22 μm and 10.36 μm, respectively, which are higher than 10 μm.

As a result, Example 2 showed that a ratio of the area of the tips of the convex portions to the entire area was 10.9% and a ratio of the area of the bottoms of the concave portions to the entire area was 0.2%. Comparative Example 2 showed that a ratio of the area of the tips of the convex portions to the entire area was 11.1% and a ratio of the area of the bottoms of the concave portions to the entire area was 1.8%. It can be seen from the results that the area of the tips of the convex portions and the area of the bottoms of the concave portions in Example 2 are smaller than those in Comparative Example 2. The reason for this is that corner portions are rounded by the blasting process using the fine dry ice particles 101 so that the tips of the convex portions or the bottoms of the concave portions are reduced in size.

In the present disclosure, a non-sublimation blast material as a non-sublimation material is sprayed onto a substrate-mounting surface of the metal mounting table which is used in a parallel-plate type plasma processing apparatus configured to generate a capacitively-coupled plasma. Subsequently, a sublimation blast material as a sublimation material is sprayed onto the substrate-mounting surface of the mounting table. Alternatively, excited argon gas collides against the substrate-mounting surface of the mounting table. With this configuration, corner portions of the irregularities formed on the substrate-mounting surface of the mounting table by the spraying of the non-sublimation material are rounded. This reduces impedance defined between a substrate and the mounting table in a high frequency current path ranging from a high frequency power source to the ground via an upper electrode, the substrate and a lower electrode. Consequently, a current path ranging from a plasma generating region to a sidewall of a processing container or the like is hard to be formed, which makes it possible to stabilize the plasma and perform a stable plasma process.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of performing a surface treatment with respect to a metal mounting table for mounting a substrate to be plasma-processed, the method comprising:

performing a first surface treatment by spraying a non-sublimation blast material as a non-sublimation material onto a mounting surface of the metal mounting table on which the substrate is to be mounted and which is configured to function as a lower electrode to generate a plasma by a high frequency power applied between an upper electrode and the lower electrode; and performing, after the first surface treatment, a second surface treatment by spraying a sublimation blast material as a sublimation material onto the mounting surface, wherein areas of both tips of convex portions and bottoms of concave portions of the mounting surface are reduced by performing the second surface treatment such that an impedance between the mounting surface of the metal mounting table and a surface of the substrate is reduced.

2. The method of claim 1, wherein the sublimation blast material is a dry ice.

3. The method of claim 1, wherein the mounting surface of the metal mounting table has an average surface roughness Ra of 5 μm or more after the first surface treatment is performed.

* * * * *